United States Patent
Ikejiri et al.

(10) Patent No.: US 11,149,363 B2
(45) Date of Patent: Oct. 19, 2021

(54) GLASS CLOTH

(71) Applicant: NITTO BOSEKI CO., LTD., Fukushima (JP)

(72) Inventors: Hirotaka Ikejiri, Fukushima (JP); Teiji Endo, Fukushima (JP); Masahiro Awano, Fukushima (JP); Ryosuke Osada, Fukushima (JP)

(73) Assignee: Nitto Boseki Co., Ltd., Fukushima (JP)

( * ) Notice: Subject to any disclaimer, the term of this patent is extended or adjusted under 35 U.S.C. 154(b) by 0 days.

(21) Appl. No.: 16/320,657

(22) PCT Filed: Jan. 6, 2017

(86) PCT No.: PCT/JP2017/000317
§ 371 (c)(1),
(2) Date: Jan. 25, 2019

(87) PCT Pub. No.: WO2017/168921
PCT Pub. Date: Oct. 5, 2017

(65) Prior Publication Data
US 2019/0153635 A1    May 23, 2019

(30) Foreign Application Priority Data
Aug. 3, 2016 (JP) .............................. JP2016-152667

(51) Int. Cl.
| | |
|---|---|
| *D03D 15/25* | (2021.01) |
| *D03D 15/513* | (2021.01) |
| *D03D 1/00* | (2006.01) |
| *D03D 13/00* | (2006.01) |
| *H05K 1/03* | (2006.01) |
| *D03D 15/267* | (2021.01) |

(52) U.S. Cl.
CPC ......... *D03D 15/267* (2021.01); *D03D 1/0082* (2013.01); *D03D 13/008* (2013.01); *D03D 15/513* (2021.01); *D10B 2101/06* (2013.01); *D10B 2505/02* (2013.01); *H05K 1/0306* (2013.01); *H05K 1/0366* (2013.01); *H05K 1/0373* (2013.01); *H05K 2201/029* (2013.01)

(58) Field of Classification Search
CPC ............ D03D 15/0011; D03D 1/0082; D03D 13/008; D03D 15/12; D10B 2101/06; D10B 2505/02; H05K 1/0306; H05K 1/0366; H05K 1/0373; H05K 2201/029
See application file for complete search history.

(56) References Cited

U.S. PATENT DOCUMENTS

2016/0219700 A1* 7/2016 Hamajima ................. C08J 5/10

FOREIGN PATENT DOCUMENTS

| JP | 2001-073249 A | 3/2001 |
|---|---|---|
| JP | 2001-164441 A | 6/2001 |
| JP | 2005-213656 A | 8/2005 |
| JP | 2010-031425 A | 2/2010 |
| JP | 5905150 B1 | 4/2016 |
| TW | 201202045 A | 1/2012 |
| WO | 2015/033731 A1 | 3/2015 |

OTHER PUBLICATIONS

Office Action dated Oct. 7, 2019 issued in corresponding Taiwanese patent application No. 106101892.

* cited by examiner

*Primary Examiner* — Khoa D Huynh
*Assistant Examiner* — Erick I Lopez
(74) *Attorney, Agent, or Firm* — Carrier Blackman & Associates, P.C.; Joseph P. Carrier; Jeffrey T. Gedeon

(57) ABSTRACT

A glass cloth includes warp yarns and weft yarns formed by bundling in the range of 14 to 55 glass filaments having a diameter in the range of 3.0 to 4.2 μm, and has a weaving density of the warp yarns and the weft yarns of 86 to 140 yarns/25 mm, a thickness of 7.5 to 12.0 μm, a mass of 6.0 to 10.0 g per $m^2$, and an average number of stages of 2.00 or more and less than 3.00, an average degree of opening, which is indicated as the geometric mean of the degree of opening of the warp yarns and the degree of opening of the weft yarns, in the range of 1.000 to 1.300, and a yarn width ratio, as the ratio of the yarn width of the warp yarns to that of the weft yarns, in the range of 0.720 to 0.960.

9 Claims, No Drawings

GLASS CLOTH

TECHNICAL FIELD

The present invention relates to a glass cloth.

BACKGROUND ART

Conventionally, as insulating material in printed wiring boards, prepregs obtained by impregnating a glass cloth, composed of warp yarns and weft yarns formed by bundling a plurality of glass filaments, with a resin such as epoxy resin have been used.

Recently, for the purpose of downsizing, thinning, and function enhancement of electronic devices, thinning of the printed wiring boards and the prepregs has also been required. For this reason, a glass cloth having a reduced thickness has been proposed (e.g., see Patent Literature 1).

The glass cloth described in Patent Literature 1 comprises warp yarns formed by bundling in the range of 35 to 55 glass filaments having a diameter in the range of 3.0 to 4.3 μm and weft yarns formed by bundling in the range of 35 to 70 glass filaments. The glass cloth has a weaving density of the warp yarns and weft yarns ranging from 80 to 130 yarns/25 mm, a thickness of 14 μm or less, and a mass per unit area of 11.0 g/m$^2$ or less. It is stated that setting the degree of opening of the warp yarns in the range of 0.7 to 0.9 and the degree of opening of the weft yarns in the range of 0.95 to 1.20 can prevent generation of pinholes when a prepreg is formed by impregnating the glass cloth with a resin such as an epoxy resin.

In the present description, a value obtained by dividing the yarn width by the product of the diameter and the number of the glass filaments, is the degree of opening (degree of opening=yarn width of the warp (weft) yarns/(diameter of the glass filaments constituting the warp (weft) yarns×number of the glass filaments constituting the warp (weft) yarns)).

CITATION LIST

Patent Literature

Patent Literature 1: Japanese Patent No. 5905150

SUMMARY OF INVENTION

Technical Problem

In the glass cloth described in Patent Literature 1, as an index of the thickness of the glass cloth with respect to the diameter of the glass filaments, the average number of stages exceeds 3.00, which is indicated as a value obtained by dividing the thickness of the glass cloth by the average value of the diameter of the glass filaments of the warp yarns and the diameter of the glass filaments of the weft yarns.

However, setting the average number of stages at less than 3.00, that is, further reducing the thickness of the glass cloth with respect to the glass filaments of the identical diameter may disadvantageously make it difficult to prevent generation of pinholes in a prepreg including the glass cloth.

An object of the present invention is to overcome such a disadvantage to thereby provide a glass cloth capable of preventing generation of pinholes in a prepreg using the glass cloth and of maintaining the excellent appearance quality of the prepreg because of little fluffing of the glass cloth, even with an average number of stages of less than 3.00.

Solution to Problem

In order to achieve the object, the glass cloth of the present invention comprises warp yarns and weft yarns formed by bundling in the range of 14 to 55 glass filaments having a diameter in the range of 3.0 to 4.2 μm. The glass cloth has a weaving density of the warp yarns and weft yarns in the range of 86 to 140 yarns/25 mm, a thickness in the range of 7.5 to 12.0 μm, and a mass in the range of 6.0 to 10.0 g per m$^2$. An average number of stages of the glass cloth, which is indicated as a value obtained by dividing the thickness of the glass cloth by the average value of the diameter of the glass filaments of the warp yarns and the diameter of the glass filaments of the weft yarns (thickness of the glass cloth/{(diameter of the glass filaments of the warp yarns+diameter of the glass filaments of the weft yarns)/2}), is in the range of 2.00 or more and less than 3.00. An average degree of opening of the glass cloth, which is indicated as the geometric mean of the degree of opening of the warp yarns and the degree of opening of the weft yarns ((degree of opening of the warp yarns×degree of opening of the weft yarns)$^{1/2}$), is in the range of 1.000 to 1.300. A yarn width ratio, which is indicated as the ratio of the yarn width of the warp yarns to the yarn width of the weft yarns (yarn width of the warp yarns/yarn width of the weft yarns), is in the range of 0.720 to 0.960.

The glass cloth of the present invention, which comprises warp yarns and weft yarns, is required to have a thickness in the range of 7.5 to 12.0 μm and a mass in the range of 6.0 to 10.0 g per m$^2$ and have an average number of stages in the range of 2.00 or more and less than 3.00 for use in prepregs adaptable to downsizing, thinning, and function enhancement of electronic devices. When the thickness exceeds 12.0 μm, the mass per m$^2$ exceeds 10.0 g, or the average number of stages is 3.00 or more in the glass cloth of the present invention, it is not possible to adapt the glass cloth to the downsizing, thinning, and function enhancement of the electronic devices at a high level.

Furthermore, in the glass cloth of the present invention, it is technically difficult to reduce the thickness to less than 7.5 μm, the mass per m$^2$ to less than 6.0 g, or the average number of stages to less than 2.00.

In the glass cloth of the present invention, in order to set the thickness and the average number of stages within the range, the warp yarns and weft yarns are required to be formed by bundling in the range of 14 to 55 glass filaments having a diameter in the range of 3.0 to 4.2 μm. When the diameter of the glass filaments constituting the warp yarns or the weft yarns exceeds 4.2 μm or the number of the glass filaments exceeds 55, the thickness of the glass cloth and the average number of stages each exceeds the range. It is difficult to reduce the diameter of the glass filaments constituting the warp yarns or the weft yarns to less than 3.0 μm because their influence on human body is concerned. When the number of the glass filaments is less than 14, it is difficult to weave a glass cloth.

When the warp yarns and weft yarns are used in the glass cloth of the present invention, it is required that the weaving density of the warp yarns and weft yarns is in the range of 86 to 140 yarns/25 mm. When the weaving density of the warp yarns or the weft yarns exceeds 140 yarns/25 mm, the weaving efficiency of the glass cloth is reduced. In contrast, when the weaving density of the warp yarns or the weft yarns is less than 86 yarns/25 mm, it is increasingly difficult to prevent generation of pinholes in a prepreg including the glass cloth.

The glass cloth of the present invention comprising the constitution mentioned above, in which the average degree of opening, which is indicated as the geometric mean of the degree of opening of the warp yarns and the degree of opening of the weft yarns ((degree of opening of the warp yarns×degree of opening of the weft yarns)$^{1/2}$), is in the range of 1.000 to 1.300, and the yarn width ratio, which is indicated as the ratio of the yarn width of the warp yarns to the yarn width of the weft yarns (yarn width of the warp yarns/yarn width of the weft yarns), is in the range of 0.720 to 0.960, can prevent generation of pinholes in a prepreg including the glass cloth and can maintain the excellent appearance quality of the prepreg because of little fluffing of the glass cloth. When the geometric mean of the degree of opening of the warp yarns and the degree of opening of the weft yarns is less than 1.000, the gaps between the warp yarns or the weft yarns become large, and generation of pinholes in a prepreg including the glass cloth cannot be prevented. In contrast, when the geometric mean of the degree of opening of the warp yarns and the degree of opening of the weft yarns exceeds 1.300, the gaps between the glass filaments constituting the warp yarns or the weft yarns become large, and each one of the glass filaments is more likely to be cut. Thus, fluffing is more likely to occur, and the appearance quality of a prepreg including the glass cloth deteriorates. Even when the average degree of opening, which is indicated as the geometric mean of the degree of opening of the warp yarns and the degree of opening of the weft yarns, is within the range, it is difficult to set the average number of stages at less than 3.00 in the case where the ratio of the yarn width of the warp yarns to the yarn width of the weft yarns is less than 0.720. Meanwhile, in a step of producing the glass cloth, while the glass cloth is conveyed, tension is usually applied to warp yarns. Thus, the warp yarns are more tensioned than the weft yarns, and the opening treatment (treatment to increase the degree of opening by widening the yarn width) tends to be less effective for the warp yarns than in the weft yarns (the yarn width of the warp yarns becomes smaller than the yarn width of the weft yarns). Furthermore, when the tension applied to the warp yarns is reduced so that the yarn width of the warp yarns can be easily increased and the ratio of the yarn width of the warp yarns to the yarn width of the weft yarns exceeds 0.960, irregular meandering occurs in the warp yarns due to the decrease in the tension to thereby generate large gaps locally among the warp yarns, and thus, it is increasingly difficult to prevent generation of pinholes.

The glass cloth of the present invention comprising the constitution mentioned above preferably has a degree of opening of the warp yarns in the range of 0.91 to 1.13 and a degree of opening of the weft yarns in the range of 1.15 to 1.30. The glass cloth of the present invention, when it has a degree of opening of the warp yarns and a degree of opening of the weft yarns each within the range, can more securely prevent generation of pinholes in a prepreg including the glass cloth and can more securely maintain the excellent appearance quality of the prepreg because of little fluffing of the glass cloth.

Additionally, the glass cloth of the present invention preferably has a ratio of the average number of stages to the average degree of opening (average number of stages/average degree of opening) in the range of 2.40 to 2.75 when the average degree of opening is within the range. The glass cloth of the present invention, when it has a ratio of the average number of stages to the average degree of opening within the range, can most securely prevent generation of pinholes in a prepreg including the glass cloth and can most securely maintain the excellent appearance quality of the prepreg because of little fluffing of the glass cloth.

DESCRIPTION OF EMBODIMENT

Subsequently, an embodiment of the present invention will be described in more detail.

A glass cloth of the present embodiment, which comprises warp yarns and weft yarns, has a thickness in the range of 7.5 to 12.0 µm and a mass in the range of 6.0 to 10.0 g per m$^2$, and has an average number of stages of 2.00 or more and less than 3.00, can be used in prepregs adaptable to downsizing, thinning, and function enhancement of electronic devices. Herein, the warp yarns and the weft yarns are formed by bundling in the range of 14 to 55 glass filaments having a diameter in the range of 3.0 to 4.2 µm (hereinbelow, may be denoted as a filament diameter), and the weaving density of the warp yarns and weft yarns is in the range of 86 to 140 yarns/25 mm.

The average number of stages is a value obtained by dividing the thickness of the glass cloth by the average value of the diameter of the glass filaments of the warp yarns and the diameter of the glass filaments of the weft yarns, represented by the following expression:

$$\text{Average number of stages} = \text{thickness of the glass cloth}/\{(\text{warp yarn filament diameter} + \text{weft yarn filament diameter})/2\}$$

Herein, the glass cloth of the present embodiment preferably has a thickness in the range of 9.0 to 11.5 µm and more preferably has a thickness in the range of 9.5 to 11.0 µm.

Additionally, the glass cloth of the present embodiment preferably has a mass in the range of 8.0 to 9.5 g per m$^2$.

Additionally, the glass cloth of the present embodiment preferably has an average number of stages in the range of 2.20 to 2.90, more preferably has an average number of stages in the range of 2.30 to 2.85, still more preferably has an average number of stages in the range of 2.50 to 2.80, and particularly preferably has an average number of stages in the range of 2.65 to 2.75.

In the glass cloth of the present embodiment, the warp yarns and weft yarns are preferably yarns formed by bundling in the range of 27 to 40 glass filaments having a filament diameter in the range of 3.4 to 4.1 µm, more preferably yarns formed by bundling in the range of 29 to 38 glass filaments having a filament diameter in the range of 3.6 to 4.1 µm, and still more preferably yarns formed by bundling in the range of 31 to 35 glass filaments having a filament diameter in the range of 3.8 to 4.0 µm.

In the glass cloth of the present embodiment, the warp yarns and weft yarns are preferably yarns formed by bundling a substantially identical number of glass filaments having a substantially identical filament diameter. Herein, "are yarns formed by bundling a substantially identical number of glass filaments having a substantially identical filament diameter" means that the yarns have an identical nomenclature code based on the IPC-4412 standard (US System Nomenclature or SI Nomenclature). For example, when the warp yarns and weft yarns are handled as BC3750 based on the IPC-4412 standard, the yarns are regarded as "yarns formed by bundling a substantially identical number of glass filaments having a substantially identical filament diameter" even if the measured values of the filament diameters or the numbers of the filaments of the warp yarns and weft yarns are not completely matched.

In the glass cloth of the present embodiment, the weaving density of the warp yarns and weft yarns is preferably 88 to 130 yarns/25 mm, more preferably 89 to 120 yarns/25 mm, still more preferably 90 to 110 yarns/25 mm, and particularly preferably 93 to 107 yarns/25 mm.

In the glass cloth of the present embodiment, the ratio of the weaving density of the weft yarns to the weaving density of the warp yarns (weaving density of the weft yarns/weaving density of the warp yarns) is preferably 0.90 to 1.10, more preferably 0.95 to 1.05, and still more preferably 1.00, from the viewpoint of reducing the anisotropy with respect to thermal processing of printed wiring boards including the glass cloth of the present embodiment and the like.

Additionally, the glass cloth of the present embodiment has an average degree of opening, indicated as the geometric mean of the degree of opening of the warp yarns and the degree of opening of the weft yarns ((degree of opening of the warp yarns×degree of opening of the weft yarns)$^{1/2}$), in the range of 1.000 to 1.300 and a yarn width ratio, indicated as the ratio of the yarn width of the warp yarns to the yarn width of the weft yarns (yarn width of the warp yarns/yarn width of the weft yarns), in the range of 0.720 to 0.960. As a result, the glass cloth has a thin thickness of an average number of stages of less than 3.00, and additionally, can prevent generation of pinholes in a prepreg including the glass cloth and can maintain the excellent appearance quality of the prepreg because of little fluffing of the glass cloth.

Herein, in the glass cloth of the present embodiment, the average degree of opening is preferably in the range of 1.050 to 1.250, more preferably in the range of 1.055 to 1.205, still more preferably in the range of 1.060 to 1.200, particularly preferably in the range of 1.070 to 1.150, and most preferably in the range of 1.080 to 1.120 because the number of pinholes to be generated in a prepreg including the glass cloth can be more securely prevented.

Herein, the degree of opening of the warp yarns is preferably in the range of 0.91 to 1.13, more preferably in the range of 0.93 to 1.10, still more preferably in the range of 0.95 to 1.05, and particularly preferably in the range of 0.97 to 1.03. The degree of opening of the weft yarns is preferably in the range of 1.15 to 1.30, more preferably in the range of 1.16 to 1.27, still more preferably in the range of 1.17 to 1.26, and particularly preferably 1.21 to 1.25.

In the glass cloth of the present embodiment, the ratio of the yarn width of the warp yarns to the yarn width of the weft yarns is preferably in the range of 0.780 to 0.920, more preferably in the range of 0.785 to 0.910, still more preferably in the range of 0.790 to 0.900, particularly preferably in the range of 0.800 to 0.880, and most preferably in the range of 0.810 to 0.860.

The glass cloth of the present embodiment, when it has a ratio of the average number of stages to the average degree of opening (average number of stages/average degree of opening) in the range of 2.40 to 2.75, can more securely prevent generation of pinholes in a prepreg including the glass cloth and can more securely maintain the excellent appearance quality of the prepreg because of little fluffing of the glass cloth.

Herein, in the glass cloth of the present embodiment, the ratio of the average number of stages to the average degree of opening (average number of stages/average degree of opening) is preferably in the range of 2.40 to 2.67, more preferably in the range of 2.41 to 2.65, still more preferably in the range of 2.42 to 2.60, particularly preferably in the range of 2.43 to 2.58, and most preferably in the range of 2.45 to 2.56.

The thickness of the glass cloth is the average value of measured values obtained when the thickness at 15 points in the glass cloth is measured in compliance with JIS R 3420 with a micrometer. The mass of the glass cloth is the average value obtained by measuring the mass of three pieces of a glass cloth cut into a size of 200 mm×200 mm with a balance compliant to JIS R 3420, calculating the mass per m$^2$ from each mass obtained, and averaging the values.

The filament diameter each of the warp yarns and weft yarns is the average value of the measured values obtained by measuring the diameter of the glass filaments constituting the warp yarns or the weft yarns at 50 cross sections each of the warp yarns or the weft yarns with a scanning electron microscope (manufactured by Hitachi High-Technologies Corporation, product name: S-3400N, magnification: 3000×). The number of glass filaments constituting each of the warp yarns and weft yarns is the average value of the counted values obtained by counting the number of the glass filaments constituting the warp yarns or the weft yarns at 50 cross sections each of the warp yarns or the weft yarns with a scanning electron microscope (manufactured by Hitachi High-Technologies Corporation, product name: S-3400N, magnification: 500×).

The weaving density of the warp yarns and weft yarns can be obtained by counting the number of the warp (weft) yarns in a 25-mm area in the direction of warp (weft) direction by using a textile-fabric magnification glass in compliance with JIS R 3420.

The yarn width of the warp yarns and weft yarns is the average value obtained by cutting three 60 mm×100 mm samples from a glass cloth, measuring the width each of 30 warp yarns or weft yarns with a microscope (manufactured by KEYENCE CORPORATION, product name: VHX-2000, magnification: 200×), and averaging the measured values.

The glass filaments are obtained by melting a predetermined glass batch (glass raw material) and making the melted glass batch into fibers, and examples thereof that can be used include those having a composition such as a composition for E glass fibers (glass fibers for general use), a composition for high strength glass fibers, and a composition for low dielectric constant glass fibers. Herein, the composition for E glass fibers contains 52 to 56% by mass $SiO_2$, 5 to 10% by mass $B_2O_3$, 12 to 16% by mass $Al_2O_3$, 20 to 25% by mass CaO and MgO in total, and 0 to 1% by mass $Na_2O$, $K_2O$, and $Li_2O$ in total. The composition for high strength glass fibers contains 57 to 70% by mass $SiO_2$, 18 to 30% by mass $Al_2O_3$, 0 to 13% by mass CaO, 5 to 15% by mass MgO, 0 to 1% by mass $Na_2O$, $K_2O$, and $Li_2O$ in total, 0 to 1% by mass $TiO_2$, and 0 to 2% by mass $B_2O_3$. The composition for low dielectric constant glass fibers contains 50 to 60% by mass $SiO_2$, 18 to 25% by mass $B_2O_3$, 10 to 18% by mass $Al_2O_3$, 2 to 9% by mass CaO, 0.1 to 6% by mass MgO, 0.05 to 0.5% by mass $Na_2O$, $K_2O$, and $Li_2O$ in total, and 0.1 to 5% by mass $TiO_2$.

The glass filaments preferably have the composition for E glass fibers from the viewpoint of versatility, and preferably have the composition for high strength glass fibers from the viewpoint of preventing warping when the fibers are made into a prepreg. In this case, the composition for high strength glass fibers preferably contains 64 to 66% by mass $SiO_2$, 24 to 26% by mass $Al_2O_3$, and 9 to 11% by mass MgO, and more preferably contains 99% by mass or more $SiO_2$, $Al_2O_3$, and MgO in total.

The glass filaments are bundled in the range of 14 to 55 filaments by a method known per se to be formed into the warp yarns or the weft yarns. Obtaining glass filaments by melting a glass batch and making the melted glass batch into fibers followed by obtaining warp yarns or weft yarns by bundling a plurality of these glass filaments is referred to as spinning.

The glass cloth of the present embodiment can be obtained by weaving the warp yarns and the weft yarns with a loom known per se and performing opening treatment. Examples of the loom may include jet looms such as air jet or water jet looms, shuttle looms, and rapier looms. Examples of weaving with a loom may include plain weaving, satin weaving, mat weaving, and twill weaving.

Examples of the opening treatment may include opening by means of water flow pressure, opening by means of high-frequency vibration using a liquid as a medium, opening by means of the pressure of a fluid having a surface pressure, and opening by means of pressing with a roll. Among these opening treatments, opening by means of water flow pressure or opening by means of high-frequency vibration using a liquid as a medium is preferably used because variations in the yarn width each of the warp yarns and the weft yarns after the opening treatment are reduced. Combination of a plurality of the opening treatments can prevent occurrence of appearance defects in the glass cloth, such as bowed filling, attributable to the opening treatment.

Subsequently, examples and comparative example of the present invention will be described.

EXAMPLES

Example 1

In the present example, first, glass filaments of a composition for E glass fibers were spun to thereby obtain warp yarns and weft yarns. The warp yarns and weft yarns are each formed by bundling 34 glass filaments having a filament diameter of 4.0 μm and have a mass of $1.10 \times 10^{-6}$ kg per m.

Then, weaving was performed by use of an air jet loom with the weaving density of the warp yarns and the weaving density of the weft yarns each set to 105 yarns/25 mm to obtain a plain-woven glass cloth.

The glass cloth was subjected to desizing treatment, surface treatment, and opening treatment to obtain the glass cloth of the present example.

As the desizing treatment herein, a treatment was employed including placing the glass cloth in a heating oven having an atmosphere temperature of 400° C. to 450° C. for 40 hours to thereby pyrolytically decompose a sizing agent adhering to the glass cloth for spinning and a sizing agent adhering to the glass cloth for weaving.

As the surface treatment, a treatment was employed including coating the glass cloth with a silane coupling agent and continuously passing the cloth through a heating oven at 130° C. to thereby cure the coupling agent.

As the opening treatment, an opening treatment using water flow pressure was employed in which a tension of 50 N was applied to the warp yarns of the glass cloth and the water flow pressure was set at 1.0 MPa.

In steps other than the opening treatment, the tension applied to the warp yarns of the glass cloth was 70 to 120 N. In the opening treatment, the tension was adjusted by feeding back the tension value detected by a tension detector to a guide roller conveying the glass cloth and altering the position of the guide roller.

Then, the glass cloth obtained in the present example was immersed in an epoxy resin (manufactured by DIC Corporation, product name: EPICLON 1121N-80N), which was diluted with methyl ethyl ketone, to impregnate the glass cloth with the resin. After the cloth was passed through a slit of 15 μm in width to remove the excess resin, the cloth was maintained in a dryer at a temperature of 150° C. for one minute to semi-cure the glass cloth impregnated with the epoxy resin to thereby obtain a prepreg sheet sample for evaluation.

Subsequently, a 200 mm×600 mm area on the surface of the prepreg sheet sample for evaluation was visually checked to count the number of pinholes generated (pinhole number). The pinholes were observed as portions not filled with the resin in the gap portions of the glass cloth. The case of a pinhole number of 0 to 2 was defined as "⊚", the case of 3 to 5 was defined as "○", and the case of 6 or more was defined as "x". Results are shown in Table 1.

Additionally, while a 500 mm×1000 mm area in the glass cloth obtained in the present example was irradiated with light from the orthogonal direction by use of an appearance tester for glass cloth, the surface of the glass cloth was visually checked and the number of fluffing points generated (number of fluffing points) was counted. The case of a number of fluffing points of less than 20 was defined as "○", and the case of 20 or more was defined as "x". The fluffing is a portion where a glass filament is cut and protrudes from a warp (weft) yarn, observed as a portion that strongly reflects light. Results are shown in Table 1.

Example 2

In the present example, a plain-woven glass cloth was obtained exactly in the same manner as in Example 1 except that both the weaving density of the warp yarns and the weaving density of the weft yarns were set at 95 yarns/25 mm.

Subsequently, the number of pinholes and the number of fluffing points of the glass cloth obtained in the present example were evaluated exactly in the same manner as in Example 1. Results are shown in Table 1.

Example 3

In the present example, a glass cloth was obtained exactly in the same manner as in Example 1 except that the opening treatment was performed with the tension applied to the warp yarns of the glass cloth set at 70 N.

Subsequently, the number of pinholes and the number of fluffing points of the glass cloth obtained in the present example were evaluated exactly in the same manner as in Example 1. Results are shown in Table 1.

Comparative Example 1

In the present comparative example, a glass cloth was obtained exactly in the same manner as in Example 1 except that the opening treatment was performed with the tension applied to the warp yarns of the glass cloth set at 70 N and the water flow pressure set at 0.5 MPa.

Subsequently, the number of pinholes and the number of fluffing points of the glass cloth obtained in the present comparative example were evaluated exactly in the same manner as in Example 1. Results are shown in Table 1.

Comparative Example 2

In the present comparative example, a glass cloth was obtained exactly in the same manner as in Example 1 except that a plain-woven glass cloth was obtained with both the weaving density of the warp yarns and the weaving density of the weft yarns set at 95 yarns/25 mm and the opening treatment was performed with the tension applied to the warp yarns of the glass cloth set at 30 N and the water flow pressure set at 1.5 MPa.

Subsequently, the number of pinholes and the number of fluffing points of the glass cloth obtained in the present comparative example were evaluated exactly in the same manner as in Example 1. Results are shown in Table 1.

Comparative Example 3

In the present comparative example, a glass cloth was obtained exactly in the same manner as in Example 1 except that a plain-woven glass cloth was obtained with both the weaving density of the warp yarns and the weaving density of the weft yarns set at 95 yarns/25 mm and the opening treatment was performed with the tension applied to the warp yarns of the glass cloth set at 100 N and the water flow pressure set at 1.0 MPa.

Subsequently, the number of pinholes and the number of fluffing points of the glass cloth obtained in the present comparative example were evaluated exactly in the same manner as in Example 1. Results are shown in Table 1.

Comparative Example 4

In the present comparative example, a glass cloth was obtained exactly in the same manner as in Example 1 except that a plain-woven glass cloth was obtained with both the weaving density of the warp yarns and the weaving density of the weft yarns set at 95 yarns/25 mm and the opening treatment was performed with the tension applied to the warp yarns of the glass cloth set at 5 N and the water flow pressure set at 1.0 MPa.

Subsequently, the number of pinholes and the number of fluffing points of the glass cloth obtained in the present comparative example were evaluated exactly in the same manner as in Example 1. Results are shown in Table 1.

It is clearly seen from Table 1 that, with the glass cloths of Examples 1 to 3 according to the present invention, generation of pinholes in the prepreg including the glass cloth can be prevented and a glass cloth having little fluffing can be obtained.

In contrast, in the glass cloth of Comparative Example 1, although the average degree of opening was as low as 0.999 and the number of fluffing points was small, it was not possible to prevent generation of pinholes in the prepreg including the glass cloth. In the glass cloth of Comparative Example 2, although the average degree of opening was as high as 1.309 and it was possible to prevent generation of pinholes in the prepreg including the glass cloth, the number of fluffing points was large. In the glass cloth of Comparative Example 3, although the yarn width ratio was as low as 0.669 and it was possible to prevent generation of pinholes in the prepreg including the glass cloth and the number of fluffing points was small, the average number of stages was 3.00 and the glass cloth had an insufficient thickness. In the glass cloth of Comparative Example 4, the yarn width ratio was as high as 0.981 and the number of fluffing points was small. However, irregular meandering occurred in the warp yarns in the process of producing the glass cloth to thereby generate large gaps locally among the warp yarns, and thus, it was not possible to prevent generation of pinholes in the prepreg including the glass cloth.

The invention claimed is:

1. A glass cloth comprising warp yarns and weft yarns formed by bundling in a range of 14 to 38 glass filaments having a diameter in a range of 3.0 to 4.0 μm, the glass cloth having a weaving density of the warp yarns and weft yarns in a range of 95 to 140 yarns/25 mm, a thickness in a range of 7.5 to 12.0 μm, a mass in a range of 6.0 to 9.5 g per m$^2$, and an average number of stages, which is indicated as a value obtained by dividing the thickness of the glass cloth by an average value of a diameter of the glass filaments of the warp yarns and a diameter of the glass filaments of the weft yarns (thickness of the glass cloth/{(diameter of the glass

TABLE 1

| | | Example | | | Comparative Example | | | |
|---|---|---|---|---|---|---|---|---|
| | | 1 | 2 | 3 | 1 | 2 | 3 | 4 |
| Warp yarn | Weaving density (yarns/25 mm) | 105 | 95 | 105 | 105 | 95 | 95 | 95 |
| | Filament diameter (μm) | 4.0 | 4.0 | 4.0 | 4.0 | 4.0 | 4.0 | 4.0 |
| | Number of filaments (filaments) | 34 | 34 | 34 | 34 | 34 | 34 | 34 |
| | Yarn width (μm) | 136 | 136 | 124 | 124 | 165 | 115 | 155 |
| | Degree of opening | 1.00 | 1.00 | 0.91 | 0.91 | 1.21 | 0.85 | 1.14 |
| Weft yarn | Weaving density (yarns/25 mm) | 105 | 95 | 105 | 105 | 95 | 95 | 95 |
| | Filament diameter (μm) | 4.0 | 4.0 | 4.0 | 4.0 | 4.0 | 4.0 | 4.0 |
| | Number of filaments (filaments) | 34 | 34 | 34 | 34 | 34 | 34 | 34 |
| | Yarn width (μm) | 167 | 161 | 160 | 149 | 192 | 172 | 158 |
| | Degree of opening | 1.23 | 1.18 | 1.18 | 1.10 | 1.41 | 1.26 | 1.16 |
| | Thickness (μm) | 11.0 | 11.0 | 11.7 | 11.8 | 10.5 | 12.0 | 11.0 |
| | Mass (g/m$^2$) | 9.2 | 8.3 | 9.2 | 9.2 | 8.3 | 8.3 | 8.3 |
| | Yarn width ratio | 0.814 | 0.845 | 0.775 | 0.832 | 0.859 | 0.669 | 0.981 |
| | Average degree of opening | 1.108 | 1.088 | 1.036 | 0.999 | 1.309 | 1.034 | 1.151 |
| | Average number of stages | 2.75 | 2.75 | 2.93 | 2.95 | 2.63 | 3.00 | 2.75 |
| | Average number of stages/Average degree of opening | 2.48 | 2.53 | 2.82 | 2.95 | 2.01 | 2.90 | 2.39 |
| | Number of pinholes | ◎ | ◎ | ○ | X | ◎ | ○ | X |
| | Number of fluffing points | ○ | ○ | ○ | ○ | X | ○ | ○ | filaments of the warp yarns+diameter of the glass filaments of the weft yarns)/2}), in a range of 2.00 or more and less than 3.00, wherein an average degree of opening, which is indicated as a geometric mean of a degree of opening of the warp yarns (yarn width of the warp yarns/(diameter of the glass filaments constituting the warp yarns×number of the glass filaments constituting the warp yarns)) and a degree of opening of the weft yarns (yarn width of the weft yarns/(diameter of the glass filaments constituting the weft yarns×number of the glass filaments constituting the weft yarns)) ((degree of opening of the warp yarns×degree of opening of the weft yarns)$^{1/2}$), is in a range of 1.000 to 1.300, and a yarn width ratio, which is indicated as a ratio of the yarn width of the warp yarns to the yarn width of the weft yarns (yarn width of the warp yarns/yarn width of the weft yarns), is in a range of 0.720 to 0.960.

2. The glass cloth according to claim 1, wherein the degree of opening of the warp yarns is in a range of 0.91 to 1.13, and the degree of opening of the weft yarns is in a range of 1.15 to 1.30.

3. The glass cloth according to claim 1, wherein a ratio of the average number of stages to the average degree of opening (average number of stages/average degree of opening) is in a range of 2.40 to 2.75.

4. A prepreg comprising a glass cloth comprising warp yarns and weft yarns formed by bundling in a range of 14 to 38 glass filaments having a diameter in a range of 3.0 to 4.0 μm, the glass cloth having a weaving density of the warp yarns and weft yarns in a range of 95 to 140 yarns/25 mm, a thickness in a range of 7.5 to 12.0 μm, a mass in a range of 6.0 to 9.5 g per m$^2$, and an average number of stages, which is indicated as a value obtained by dividing the thickness of the glass cloth by an average value of a diameter of the glass filaments of the warp yarns and a diameter of the glass filaments of the weft yarns (thickness of the glass cloth/{(diameter of the glass filaments of the warp yarns+diameter of the glass filaments of the weft yarns)/2}), in a range of 2.00 or more and less than 3.00, wherein an average degree of opening, which is indicated as a geometric mean of a degree of opening of the warp yarns (yarn width of the warp yarns/(diameter of the glass filaments constituting the warp yarns×number of the glass filaments constituting the warp yarns)) and a degree of opening of the weft yarns (yarn width of the weft yarns/(diameter of the glass filaments constituting the weft yarns×number of the glass filaments constituting the weft yarns)) ((degree of opening of the warp yarns×degree of opening of the weft yarns)$^{1/2}$), is in a range of 1.000 to 1.300, and a yarn width ratio, which is indicated as a ratio of the yarn width of the warp yarns to the yarn width of the weft yarns (yarn width of the warp yarns/yarn width of the weft yarns), is in a range of 0.720 to 0.960.

5. The prepreg according to claim 4, wherein the glass cloth has the degree of opening of the warp yarns in a range of 0.91 to 1.13 and the degree of opening of the weft yarns in a range of 1.15 to 1.30.

6. The prepreg according to claim 4, wherein the glass cloth has a ratio of the average number of stages to the average degree of opening (average number of stages/average degree of opening) in a range of 2.40 to 2.75.

7. A printed wiring board employing a prepreg comprising a glass cloth comprising warp yarns and weft yarns formed by bundling in a range of 14 to 38 glass filaments having a diameter in a range of 3.0 to 4.0 μm, the glass cloth having a weaving density of the warp yarns and weft yarns in a range of 95 to 140 yarns/25 mm, a thickness in a range of 7.5 to 12.0 μm, a mass in a range of 6.0 to 9.5 g per m$^2$, and an average number of stages, which is indicated as a value obtained by dividing the thickness of the glass cloth by an average value of the diameter of the glass filaments of the warp yarns and the diameter of the glass filaments of the weft yarns (thickness of the glass cloth/{(diameter of the glass filaments of the warp yarns+diameter of the glass filaments of the weft yarns)/2}), in a range of 2.00 or more and less than 3.00, wherein an average degree of opening, which is indicated as a geometric mean of a degree of opening of the warp yarns (yarn width of the warp yarns/(diameter of the glass filaments constituting the warp yarns×number of the glass filaments constituting the warp yarns)) and a degree of opening of the weft yarns (the yarn width of the weft yarns/(diameter of the glass filaments constituting the weft yarns×number of the glass filaments constituting the weft yarns))((degree of opening of the warp yarns×degree of opening of the weft yarns)$^{1/2}$), is in a range of 1.000 to 1.300, and a yarn width ratio, which is indicated as a ratio of the yarn width of the warp yarns to the yarn width of the weft yarns (yarn width of the warp yarns/yarn width of the weft yarns), is in a range of 0.720 to 0.960.

8. The printed wiring board according to claim 7, wherein the glass cloth has a degree of opening of the warp yarns in a range of 0.91 to 1.13 and a degree of opening of the weft yarns in a range of 1.15 to 1.30.

9. The printed wiring board according to claim 7, wherein the glass cloth has a ratio of the average number of stages to the average degree of opening (average number of stages/average degree of opening) in a range of 2.40 to 2.75.

\* \* \* \* \*